United States Patent
Murphy

Patent Number: 5,378,992
Date of Patent: Jan. 3, 1995

[54] METHOD AND APPARATUS FOR MEASURING THE LOOP SELF IMPEDANCE OF SHIELDED WIRING NON-INTRUSIVELY UTILIZING THE CURRENT TRANSFORMER RATIO OF A SENSE CURRENT PROBE AND THE CURRENT TRANSFORMER RATIO OF A DRIVE CURRENT PROBE

[75] Inventor: Timothy A. Murphy, Lynnwood, Wash.

[73] Assignee: The Boeing Company, Seattle, Wash.

[21] Appl. No.: 75,197

[22] Filed: Jun. 10, 1993

[51] Int. Cl.⁶ ............... G01R 31/02; G01R 27/02
[52] U.S. Cl. .................. 324/627; 324/543; 324/629
[58] Field of Search ........... 324/529, 537, 541, 543, 324/544, 627, 654, 551, 629

[56] References Cited

U.S. PATENT DOCUMENTS

| | | | |
|---|---|---|---|
| 2,446,195 | 8/1948 | Shive | 324/627 |
| 2,747,160 | 5/1956 | Bird | 324/627 |
| 2,881,389 | 4/1959 | Quine | 324/627 |
| 3,839,672 | 10/1974 | Anderson | 324/543 |
| 3,952,245 | 4/1976 | Miller | 324/627 |
| 4,335,348 | 6/1982 | Reed et al. | 324/529 X |
| 4,425,542 | 1/1984 | Tsaliovich et al. | 324/627 |
| 4,463,309 | 7/1984 | Crochet et al. | 324/627 |
| 4,931,720 | 6/1990 | Garbe et al. | 324/627 |
| 4,973,911 | 11/1990 | Marshall | 324/627 X |
| 5,075,628 | 12/1991 | Shuster et al. | 324/551 X |

Primary Examiner—Gerard R. Strecker
Assistant Examiner—Diep Do
Attorney, Agent, or Firm—Conrad O. Gardner

[57] ABSTRACT

A method for non-intrusively measuring the shielding effectiveness of coaxial wiring by employing an inductive current probe which causes current to flow on the shield of the wiring. A second inductive current probe senses the current on the shield circuit and outputs a voltage which is a function of the shield current. The method employs loop self-impedance in contrast to transfer impedance.

2 Claims, 4 Drawing Sheets

Fig. 4.
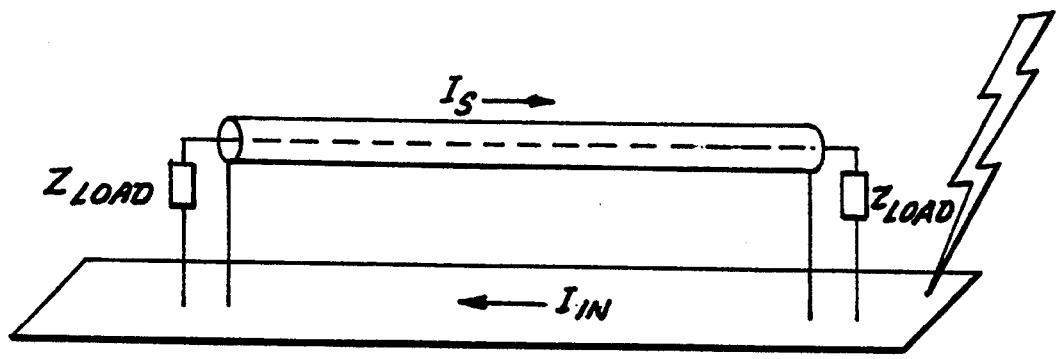
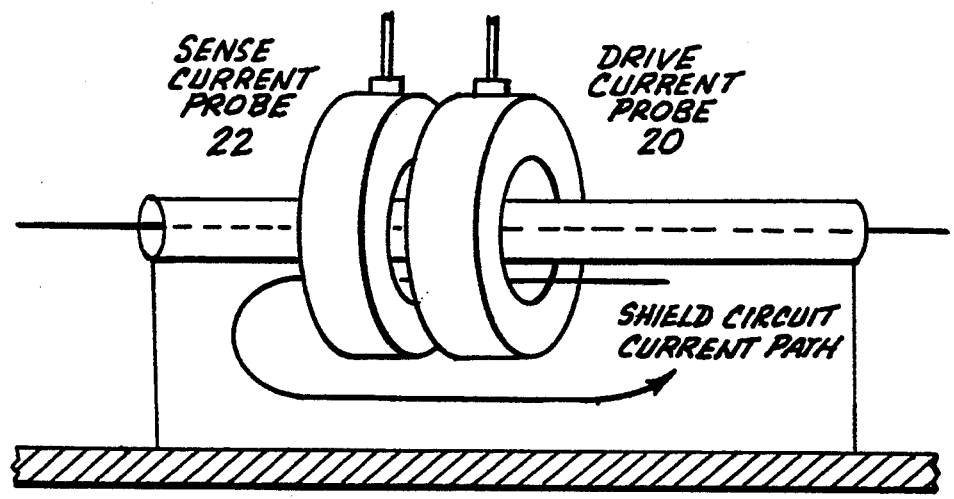
Fig. 5.
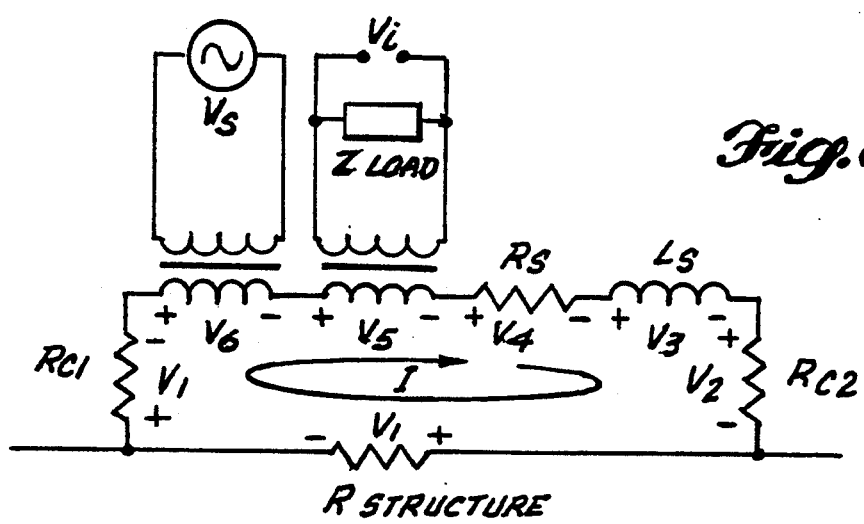
Fig. 6.

METHOD AND APPARATUS FOR MEASURING THE LOOP SELF IMPEDANCE OF SHIELDED WIRING NON-INTRUSIVELY UTILIZING THE CURRENT TRANSFORMER RATIO OF A SENSE CURRENT PROBE AND THE CURRENT TRANSFORMER RATIO OF A DRIVE CURRENT PROBE

FIELD OF INVENTION

This invention relates to the testing of electromagnetic shielding of coaxial wiring, and more particularly to the non-intrusive testing of the wiring.

BACKGROUND INFORMATION

The current state of the art in the verification of shielding effectiveness is centered around the measurement of the transfer impedance of a shielded wire. Transfer impedance is difficult and inconvenient to measure because it requires access to the core wire of the circuit to be tested. Gaining access to the core wire requires that connectors be disconnected.

There is no real industry standard definition for electromagnetic shielding effectiveness of wiring. One commonly used definition for shielding effectiveness is the ratio of the current that would be induced on a wire without shielding to the current induced on the wire with shielding in place. When the shield is in place, assuming that the shield circuit has a much lower impedance than the core wire circuit, virtually the entire amount of current that would have been induced on the core wire is induced on the shield instead. Therefore, the Shielding Effectiveness (SE) can be approximated by:

$$SE = 20 \cdot \log\left(\frac{I_{without\ shielding}}{I_{with\ shielding}}\right) = 20 \cdot \log\left(\frac{I_{shield}}{I_{core}}\right) \quad [1]$$

From FIG. 2 it can be seen that:

$$SE = 20 \cdot \log\left(\frac{\frac{I_{shield}}{V_c}}{Z_{device1} + Z_{device2}}\right) \quad [2]$$

Where $V_c$ is the potential developed along the core wire circuit. The core voltage $V_c$ is related to the shield current $I_{shield}$ by the transfer impedance ($Z_t$) of the shielded wire.

$$Z_t = \frac{V_c}{I_{shield}} \quad [3]$$

Substituting, $$SE = 20 \cdot \log\left(\frac{Z_{device1} + Z_{device2}}{Z_t}\right) \quad [4]$$

Shielding effectiveness is then the ratio of the impedance of the core wire circuit and the transfer impedance. From the expression above, it is obvious that the shielding effectiveness is not dependent only on the cable structure alone. The shielding effectiveness is a function of the load devices attached to the core wire. The transfer impedance is a characteristic of the wire alone. It should be noted that the Shielding Effectiveness is inversely proportional to the transfer impedance. Therefore, greater shielding effectiveness results from lower shielded wire transfer impedances.

Shielding effectiveness cannot typically be directly measured. It is often desirable to make an assessment of shielding integrity which is independent of what the cable is actually used for in each situation. (For example, $Z_{device1}$ may change over time and hence the shielding effectiveness for that particular circuit will change, as well.) This can be done by concentrating on the transfer impedance. Note from the equation above that if the transfer impedance is known, the shielding effectiveness of a given circuit can be computed for any arbitrary load impedances. If a change in the transfer impedance is detected, then the effects of this change on the shielding effectiveness can easily be inferred. For this reason, assessment of shielding effectiveness usually involves a measurement of the transfer impedance of shielded wires.

A typical transfer impedance measurement is shown in FIG. 3. The core wire is connected to the shield at one end and both are connected to the aircraft structure. The other end of the shielded core wire is left open circuit. A known (measured) current is induced on the shield. The shield should remain at approximately 0 volts potential with respect to the ground structure which acts as the current return. The core wire voltage is measured relative to the ground structure at the open circuit end of the core wire. Then the transfer impedance is computed by:

$$Z_t = \frac{V_c}{I_{shield}} \quad [5]$$

For a typical shielded wire, at frequencies below the cable resonance, the transfer impedance can be characterized by two elements:

$$Z_t = R_t + j\omega L_t \quad (6)$$

where $R_t$-DC Resistance of the shield circuit $L_t$-Mutual Inductance between the core wire and the shield.

There is a long history of making transfer impedance measurements in this way. The literature contains many examples of independent researchers who model shielded wires in this way as a means to assess shielding effectiveness.[1,2,3,4,5] Researchers in the field have developed models for predicting the transfer impedance of shielded wires based on physical attributes of the cable and shielding.

SUMMARY OF THE INVENTION

This invention concerns a process whereby a simple, non-intrusive electrical measurement can be used to verify the integrity of shielding on wiring. FIG. 1 gives a basic illustration of the process. Transfer impedance ($Z_t$) is the ideal physical quantity to measure in order to assess shielding effectiveness. However, transfer impedance measurement is typically inconvenient and does not lend itself to non-intrusive measurements. The loop self-impedance ($Z_s$) is physical quantity which, when measured, supplies much of the same information about the shielding effectiveness as the transfer impedance. The state of the transfer impedance may be inferred from the measurement of the loop self-impedance. The new process provides a non-intrusive measurement of the loop self-impedance.

The measurement process is as follows. A voltage is applied to the drive of an inductive current probe which causes a current to flow on the shield of the wiring under test. Another inductive current probe senses the current on the shield circuit and outputs a voltage, which is a function of the shield current. It is shown hereinafter that shield circuit loop impedance can be determined from the drive and sense voltages, the characteristics of the current probes and the input impedance of the measurement device. The characteristics of the current probes and the input impedance of the measurement device are determined by performing a calibration measurement.

The current probes used in this process can be the clamp-on type. (Other current sensors may be used if the appropriate transfer functions are derived.) It is not necessary that the wiring be disconnected or disturbed in any way to make this measurement.

BRIEF DESCRIPTION OF THE DRAWINGS

FIG. 4 is a schematic diagram helpful in understanding idealized cable coupling;

FIG. 5 is a schematic diagram showing inductive current probes used to drive current on shield circuit and also measure the resultant current;

FIG. 6 shows the equivalent circuit for shield circuit with drive and sense probes attached;

BEST MODE FOR CARRYING OUT THE INVENTION

THEORETICAL BASIS OF THE PRESENT INVENTION

Figure 1:
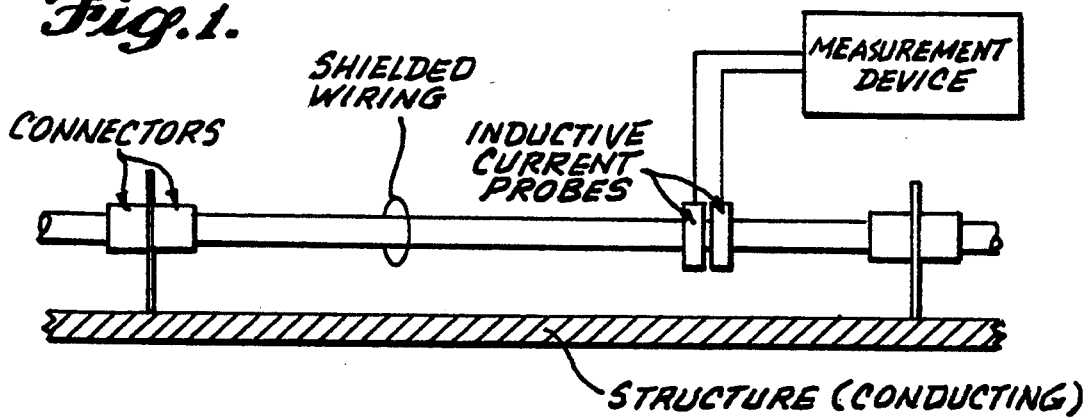
FIG. 1 is a block diagram illustrative of the present system.
Figure 2:
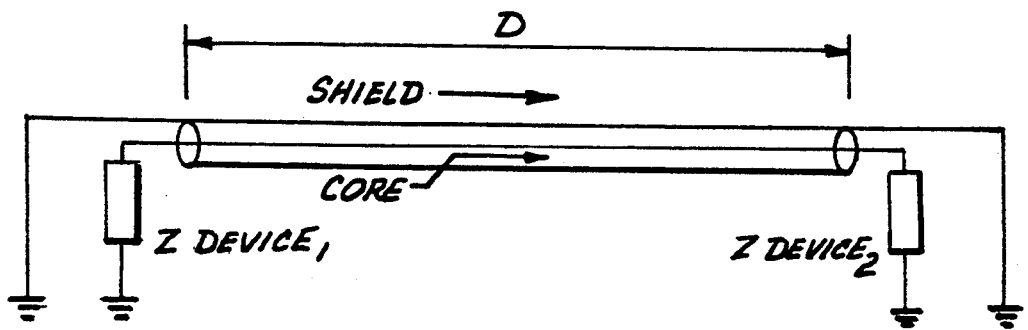
FIG. 2 is a block diagram illustrative of current flows in a coaxial cable helpful in understanding the equations for deriving SE (Shielding Effectiveness)
Figure 3:
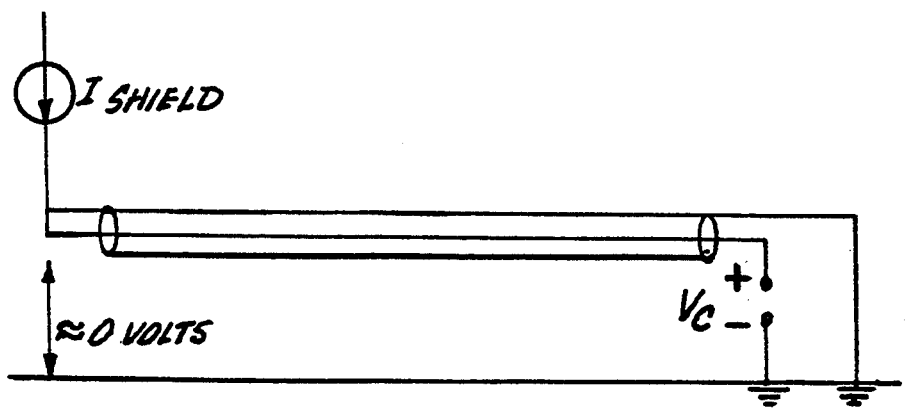
FIG. 3 is a diagram helpful in understanding a typical transfer impedance measurement.

As hereinbefore mentioned, transfer impedance is the ideal physical quantity to measure in order to assess shielding effectiveness. However, transfer impedance measurement is typically inconvenient and does not lend itself to non-intrusive measurements. The loop self-impedance ($Z_s$) is physical quantity which, when measured, supplies much of the same information about the shielding effectiveness as the transfer impedance. The state of the transfer impedance may be inferred from the measurement of the loop self-impedance. To understand this, consider the simple case illustrated in FIG. 4.

The current flowing on the structure, $I_{in}$, will produce a magnetic field, which will in turn induce a voltage potential around the loop formed by the shielded wire. The induced voltage is given by:

$$V_b = \mu A \frac{dH}{dt} \quad [7]$$

where $V_b$-is the voltage induced on the shield circuit

A-is the area of the loop formed by the wire and structure

H-is the magnetic field produced by the input current $I_{in}$

The coupling between the structure current and the voltage induced on a shield circuit can be expressed in terms of a mutual inductance:

$$\frac{V_b}{I_{in}} = j\omega M \quad [8]$$

where:

$\omega$-is the frequency in radians per second j-is the square root of -1

M-is the mutual coupling between input current $I_{in}$ and the loop formed by the wire and structure The voltage induced on the shield circuit causes a current, $I_s$, to flow on the shield The amount of the current depends on the loop self-impedance of the shield circuit.

$$I_s = \frac{V_b}{Z_s} = \frac{j\omega M}{R_s + j\omega L_s} \quad [9]$$

where $R_s$-is the dc resistance of the shield circuit loop $L_s$-is the self-inductance of the shield circuit loop From the previous discussion concerning transfer impedance, voltage induced on the core wire is related to the shield current by the transfer impedance. Therefore, the voltage induced on a core wire is related to the current on the structure by:

$$\frac{V_c}{I_{in}} = \frac{j\omega M Z_t}{Z_s} = \frac{j\omega M(R_t + j\omega L_t)}{R_s + j\omega L_s} \quad [10]$$

Inspection of [10] reveals some interesting relationships. For a given excitation current, $I_{in}$, the voltage induced on a core wire is a linear function of $Z_t$. Furthermore, it appears that an increase in the bundle self-inductance will decrease the coupled voltage. This is in general true; however, it must be realized that $Z_t$ and $Z_s$ are not independent. Both quantities are a function of the physical geometry of the cable. It is typically not possible to increase one without subsequently increasing the other. In fact, $R_t$ is approximately equal to $R_s$. ($R_s$ is slightly larger than $R_t$ as $R_s$ includes the resistance of structure which is part of the shield circuit loop.) It is this co-dependence of both $Z_t$ and $Z_s$ on the physical wiring structure which supports the use of a measurement of $Z_s$ as an indication of shielding effectiveness. Measuring $Z_s$ will directly give a measurement of $R_t$. An increase in the inductive portion of $Z_s$ is a very good indication that there has been an increase in the transfer impedance $Z_t$. If $Z_s$ remains unchanged, it is a good indication that the wiring structure is unchanged, and therefore $Z_t$ is unchanged, and therefore the shielding effectiveness is unchanged.

It has been the experience of many workers in the field that the most common and severe problems with shielded wiring are due to maintenance or mechanical failures involving the connectors. For example, a backshell becomes loose or a shield is broken from the connector. These failures are drastic because they can render the cable shielding completely ineffective. Another problem associated with current path transitions are increased contact resistance. A simple, non-intrusive measurement of $R_t$ (or $R_s$) will detect a large percentage of the most common shielding failures. Measurement of $Z_s$ provides a simple and non-intrusive means of detecting the most common types of failures in shielded wires.

INVENTION DESCRIPTION

The present method is based on the following fundamentals. A known voltage is applied to the secondary side of a current transformer (i.e., an inductive current probe). The primary side of the current transformer is the shield circuit itself. The amount of current which will flow in the primary (and secondary) of the current transformer is dependent on the impedance of the primary circuit. The amount of current flowing in the primary circuit is measured. Appropriate corrections are made to account for the loading of the shield circuit by current probes. The loop impedance is then determined from the known input voltage and resultant current.

A schematic diagram is shown in FIG. 5. In the following discussion it is assumed that inductive current probes will be used for both drive probe 20 and sense current probe 22. Other types of current sensors may be used if care is taken to derive the appropriate transfer function for the system. FIG. 5 shows two separate probes for simplicity. Both probes may be housed in a single unit as long as sufficient isolation between probes is preserved.

FIG. 6 gives an equivalent circuit for the apparatus shown in FIG. 5. The shield self-impedance is actually comprised of several different elements including the resistances of the shield material, the resistance drop across connectors, the resistance of the return structure and the self inductance of the shield.

Figure 7:
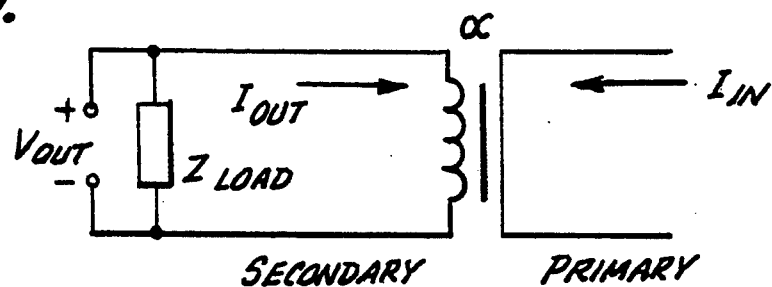
FIG. 7 shows the current probes of FIG. 6 considered as current transformers.

The current probes can be considered to be current transformers, as shown in FIG. 7. The current transformers can be characterized by the effective turns ratio:

$$\alpha = \frac{I_{out}}{I_{in}} = \frac{Z_t}{Z_{load}} \quad [11]$$

where $Z_t$ is the transfer impedance of the current probe given by:

$$Z_t = \frac{V_{out}}{I_{in}} \quad [12]$$

Figure 8:
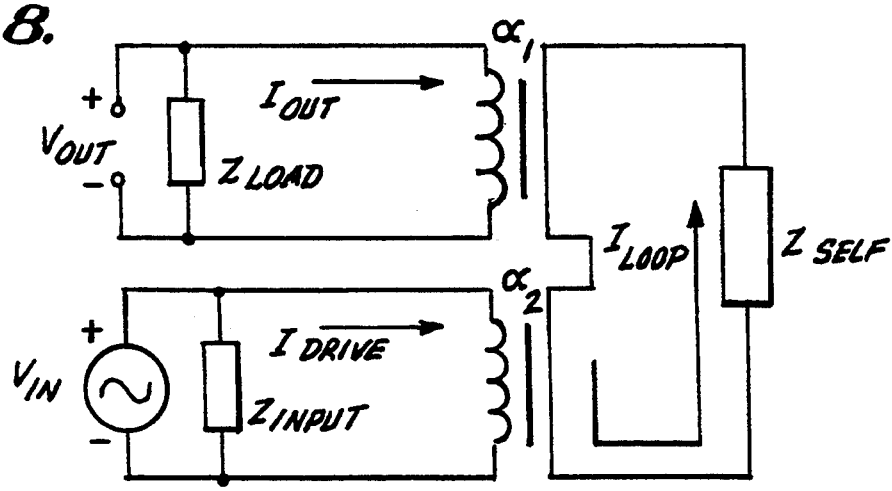
FIG. 8 is a schematic diagram which is a further simplification of the equivalent circuit of FIG. 6 wherein all the shield circuit impedances are lumped into a single impedance.

Lumping all the shield circuit self-impedances into a single impedance, the equivalent circuit in FIG. 6 can further be simplified as shown in FIG. 8.

Figure 9:
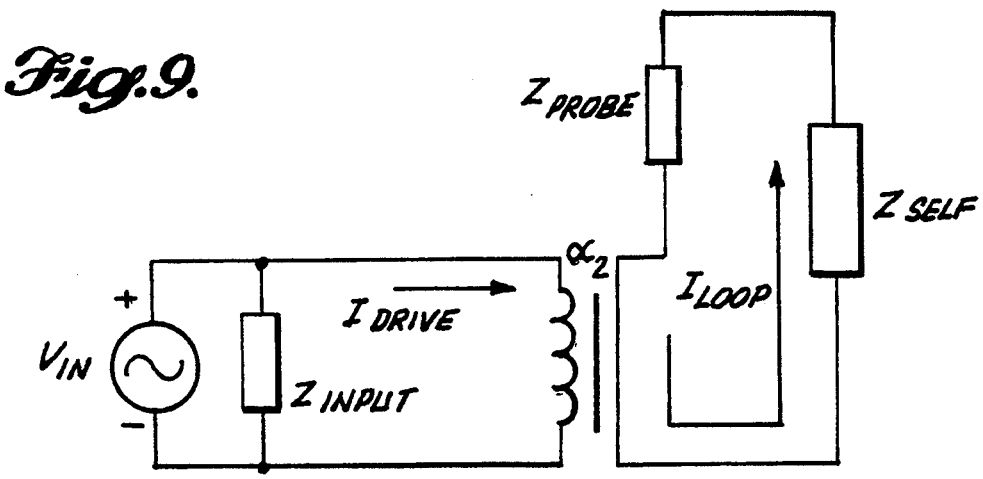
FIG. 9 is a schematic diagram which is a further simplification of the equivalent circuit of FIG. 8.

The sense probe will load the shield loop with some impedance. For a simple current transformer, an impedance on the secondary circuit is related to the impedance seen by the primary circuit by the square of the effective turns ratio. Therefore, the circuit in FIG. 8 can further be simplified as shown in FIG. 9 where:

$$Z_{probe} = \alpha_1^2 Z_{load} \quad [13]$$

Figure 10:
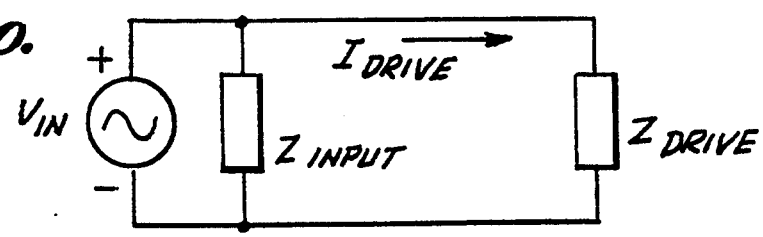
FIG. 10 is a schematic diagram which is a further simplification of the equivalent circuit of FIG. 9.

The total loop impedance of the loop ($Z_{probe} + Z_{self}$) can be transferred to the secondary side of the drive circuit giving the circuit illustrated in FIG. 10.

The impedance seen by the drive circuit is given by:

$$Z_{drive} = \frac{Z_{self} + Z_{probe}}{\alpha_2^2} = \frac{Z_{self} + \alpha_1^2 Z_{load}}{\alpha_2^2} \quad [14]$$

Therefore the current in the secondary side of the drive circuit is given by:

$$I_{drive} = \frac{V_{in}}{Z_{drive}} = \frac{V_{in}\alpha_2^2}{Z_{self} + \alpha_1^2 Z_{load}} \quad [15]$$

Knowing the secondary current, the primary current (which is the loop current) can be calculated:

$$I_{loop} = \frac{I_{drive}}{\alpha_2} = \frac{V_{in}\alpha_2}{Z_{self} + \alpha_1^2 Z_{load}} \quad [16]$$

Finally, the output voltage is related to the loop current by the probe transfer impedance.

$$V_{out} = Z_{t1} I_{loop} = \alpha_1 Z_{load} I_{loop} = \frac{V_{in}\alpha_2\alpha_1 Z_{load}}{Z_{self} + \alpha_1^2 Z_{load}} \quad [17]$$

Equation [17] is solved for $Z_{self}$:

$$Z_{self} = Z_s = \alpha_2\alpha_1 Z_{load} \frac{V_{in}}{V_{out}} - \quad [18]$$

$$\alpha_1^2 Z_{load} = \alpha_1 Z_{load} \left( \alpha_2 \frac{V_{in}}{V_{out}} - \alpha_1 \right)$$

Figure 11:
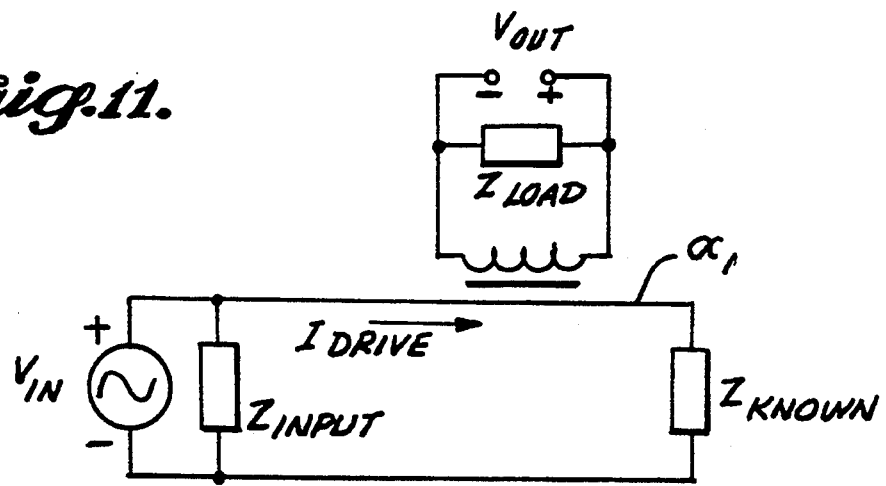
FIG. 11 is a schematic diagram showing a calibration circuit for determining $\alpha_1$; and, FIG. 12 is a schematic diagram illustrative of a calibration circuit for determining $\alpha_2$.

Equation [18] gives the fundamental relationship used to determine $Z_s$. The quantities $V_{in}$ and $V_{out}$ are measured. The quantities $\alpha_1, \alpha_2$ and $Z_{load}$ are determined as a result of a two-step calibration performed before $Z_s$ is measured. Step one of the calibration determines $\alpha_1$. FIG. 11 shows the calibration setup used to determine $\alpha_1$. The sense probe alone is connected to a loop in which a known voltage is impressed across a known load. This allows the primary loop current to be known precisely and then the secondary loop current is calculated by the measured output voltage divided by the load impedance. (It is assumed that the load impedance is known and periodically checked against traceable standards.) The cables connecting the secondary side of the circuit should be the same cables which will be used to connect the secondary side of the circuit during the measurement of $Z_s$ so that this calibration measurement will automatically compensate for the impedance of the cables.

The effective turns ratio for the current sense probe is determined from:

$$\alpha_1 = \frac{I_{out}}{I_{in}} = \frac{V_{out}Z_{known}}{V_{in}Z_{load}} = \frac{Z_{t1}}{Z_{load}} \qquad [19]$$

Figure 12:
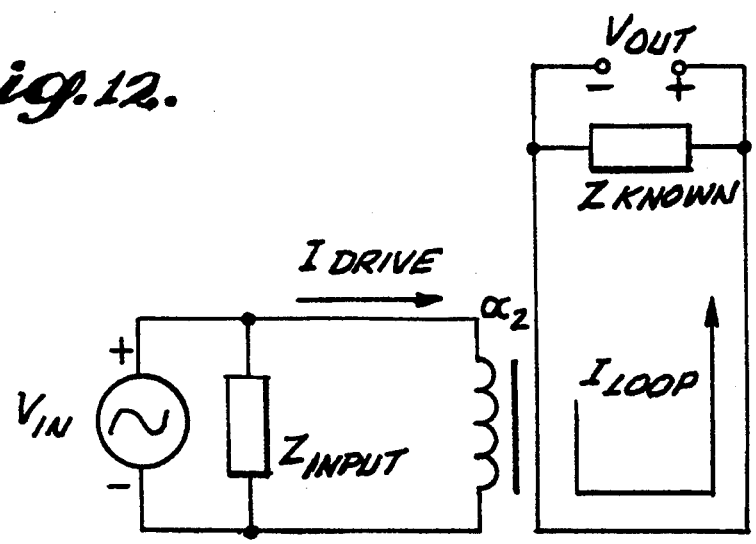

Step two of the calibration procedure determines the effective turns ratio of the drive probe, $\alpha_2$. FIG. 12 shows the calibration setup used to determine $\alpha_2$. The drive probe alone is connected to a loop which contains a known impedance. A known voltage is applied to the secondary side of the drive current transformer circuit. The voltage developed across the known impedance on the primary side of the circuit is measured. The effective turns ratio for the drive current probe is determined from:

$$\alpha_2 = \frac{I_{out}}{I_{in}} = \frac{V_{in}}{V_{out}} \qquad [20]$$

Again, the cables used to connect the secondary side of the drive circuit during the calibration should be the same cables used to connect the secondary side during the measurement of $Z_s$ so that the impedance of the cables will be automatically compensated for by the calibration routine.

The current drive and sense probes may be integrated into a single unit. If this is done, it will not be possible to separate the probes during calibration as described above. To compensate for this, during calibration, the unused probe should have a short circuit placed across the input. This will allow for the smallest possible amount of impedance to be transferred to the secondary circuit by the unused probe. If the known load impedance is very large compared to the residual loading of the unused probe, the resultant error in $\alpha_1$ and $\alpha_2$ should be negligible.

A variety of measurement equipment can be used to perform the measurement described in this disclosure. The measurement can be performed with off-the-shelf test equipment. A network analyzer such as the Hewlett Packard Model HP3577 is ideal in that this particular device can be configured to measure the drive and sense voltages as complex quantities and directly do the complex computation given in equation [18]. Any equipment capable of measuring the amplitude and phase two voltages could be used. The measurement process can be performed with any device or combination of devices which can be used to measure two sinusoidal signals and perform the computation defined in equation [18].

The measurement can be performed at a discrete frequency or a number of different frequencies. The frequency chosen depends on several factors, including the environment in which the equipment is to be used and the frequency characteristics of the current probes. However, a reasonably low frequency (i.e., 10 kHz to 15 kHz) should be used for an accurate measurement of the resistive portion of the self-impedance. (At higher frequencies the resistance of a wire is actually an increasing function of frequency clue to the skin effect.)

The required sensitivity of the voltage measuring devices is determined by the desired accuracy for the measurement, the maximum voltage drive levels, and the current probe characteristics. As a consequence, there is hereinabove described, a process whereby the loop self-impedance of shielded wiring can be measured non-intrusively. The loop self-impedance gives an indication of the state of a shielded wire's transfer impedance, and is therefore useful as a method of verifying the integrity of electromagnetic shielding of the wire.

REFERENCES:

1. L. O. Hoeft, Paul J. Miller, W. D. Prather "Development Of A Cable Shield Tester For In-Situ Hardness Surveillance of Cables," Proceedings of the International Symposium on Electromagnetic Compatibility, 1986.
2. L. O. Hoeft, "The Case for Identifying Contact Impedance as the Major Electromagnetic Hardness Degradation Factor," Proceedings of the International Symposium on Electromagnetic Compatibility, 1986 pp. 405–407.
3. L. O. Hoeft, "A Model for Predicting the Surface Transfer Impedance of Braided Cable," Proceedings of the International Symposium on Electromagnetic Compatibility, 1988 pp. 402–404.
4. Albert R. Martin and Steven E. Emert, "Shielding Effectiveness of Long Cables," Proceedings of the International Symposium on Electromagnetic Compatibility, 1979.
5. Albert R. Martin and Steven E. Emert, "Shielding Effectiveness of Long Cables, II, Lt and GTR," IEEE Transactions on Electromagnetic Compatibility, EMC-22 No. 4 pp. 169–275 (1980).

What is claimed is:

1. A method for measuring the loop self impedance of shielded wiring comprising the steps of:
   providing an inductive sense current probe;
   providing an inductive drive current probe;
   measuring the voltage impressed at the input port of said inductive drive current probe;
   measuring the voltage at the port of said inductive sense current probe;
   providing the current transformer ratio of said inductive sense current probe;
   determining the impedance of the circuit utilized to measure said voltage at port of said inductive sense current probe;
   determining the ratio of the voltage impressed at the input port of said inductive drive current probe to the voltage at the port of said inductive sense current probe and multiplying the ratio by said current transformer ratio of said inductive drive current probe and subtracting therefrom said current transformer ratio of said inductive sense current probe to obtain a resultant;
   multiplying said resultant y said current transformer ratio of said inductive sense current probe to obtain a further resultant; and then
   multiplying said further resultant by said impedance of the circuit utilized to measure said voltage at the port of said inductive sense current probe thereby obtaining the loop self impedance of said shielded wiring.

2. A method for measuring the loop self impedance of shielded wiring comprising the steps of:
   providing an inductive sense current probe;
   providing an inductive drive current probe;
   measuring the voltage $V_{in}$ impressed at the input port of said inductive drive current probe;
   measuring the voltage $V_{out}$ at the port of said inductive sense current probe;
   providing the current transformer ratio $\alpha_1$ of said inductive sense current probe;
   providing the current transformer ratio $\alpha_2$ of said inductive drive current probe;

determining the impedance $Z_{load}$ of the circuit utilized to measure said voltage at port of said inductive sense current probe; and then, computing the loop self impedance $Z_s$ where:

$$Z_s = \alpha_1 Z_{load} \left( \alpha_2 \frac{V_{in}}{V_{out}} - \alpha_1 \right)$$

multiplying said resultant y said current transformer ratio of said inductive sense current probe to obtain a further resultant; and then multiplying said further resultant by said impedance of the circuit utilized to measure said voltage at the port of said inductive sense current probe thereby obtaining the loop self impedance of said shielded wiring.

* * * * *